US012435408B2

(12) United States Patent
Zhang et al.

(10) Patent No.: US 12,435,408 B2
(45) Date of Patent: Oct. 7, 2025

(54) METHOD FOR IMPROVING THE UNIFORMITY OF RARE EARTH NICKELATE THIN FILMS DEPOSITED BY REACTIVE MAGNETRON SPUTTERING

(71) Applicant: Xi'an Jiaotong University, Xi'an (CN)

(72) Inventors: Zhen Zhang, Xi'an (CN); Xurong Qiao, Xi'an (CN); Jiahui Sun, Xi'an (CN)

( * ) Notice: Subject to any disclaimer, the term of this patent is extended or adjusted under 35 U.S.C. 154(b) by 0 days.

(21) Appl. No.: 19/031,111

(22) Filed: Jan. 17, 2025

(65) Prior Publication Data

US 2025/0188596 A1 Jun. 12, 2025

(30) Foreign Application Priority Data

Apr. 23, 2024 (CN) ......................... 202410486712.2

(51) Int. Cl.

*C23C 14/54* (2006.01)
*C23C 14/08* (2006.01)
*C23C 14/34* (2006.01)
*C23C 14/35* (2006.01)

(52) U.S. Cl.

CPC ............ *C23C 14/54* (2013.01); *C23C 14/085* (2013.01); *C23C 14/3492* (2013.01); *C23C 14/35* (2013.01)

(58) Field of Classification Search

CPC .......................... C23C 14/085; C23C 14/3492
See application file for complete search history.

(56) References Cited

U.S. PATENT DOCUMENTS

2011/0062016 A1* 3/2011 Araki ................ H01L 21/02631 204/192.25
2012/0031749 A1* 2/2012 Dubs .................. H01J 37/3426 204/192.15

FOREIGN PATENT DOCUMENTS

CN 115537744 A * 12/2022 ............ C23C 14/16

OTHER PUBLICATIONS

CN202410486712.2 Cnipa first Office Action, original Chinese, dated Apr. 23, 2024, pp. 1-3.
CN202410486712.2 Cnipa first Office Action, dated Apr. 23, 2024, English machine translation generated Jan. 16, 2025, pp. 1-3.

* cited by examiner

*Primary Examiner* — John J Brayton
(74) *Attorney, Agent, or Firm* — Addison D. Ault; IPGentleman Intellectual Property Services, LLC

(57) ABSTRACT

The present invention relates to the technical field of magnetron sputtering process, and specifically to a method for improving the uniformity of rare earth nickelate thin film deposited by reactive magnetron sputtering, comprising the following steps: adjusting the sputter angle of a Ni target toward a substrate to perform magnetron sputtering to deposit a thin film, and obtaining the content data of the Ni element in the deposited thin film; analyzing the content data of the Ni element to screen out the sputter angle for realizing zero-gradient deposition of the Ni element on the substrate surface; similarly, screening out the sputter angle for realizing zero-gradient deposition of the RE element on the substrate surface; preparing a nickelate thin film according to the screened zero-gradient sputter angle of Ni target material and the RE target material so as to improve the deposition uniformity of the rare earth nickelate thin film. The present invention aims to solve the problem that the introduction of reactive gas in the state of art magnetron sputtering process compromises the uniformity of the product thin film.

5 Claims, 6 Drawing Sheets

Classification of gradient deposition

| Gradient deposition type | Element distribution trend | |
|---|---|---|
| Positive gradient deposition | Upslope trend |  |
| Negative gradient deposition | Downslope trend |  |
| Zero gradient deposition | Horizontal trend |  |

METHOD FOR IMPROVING THE UNIFORMITY OF RARE EARTH NICKELATE THIN FILMS DEPOSITED BY REACTIVE MAGNETRON SPUTTERING

TECHNICAL FIELD

The invention relates to the technical field of magnetron sputtering technology, and in particular to a method for improving the uniformity of a rare earth nickelate film deposited by reactive magnetron sputtering.

BACKGROUND ART

Common physical thin film deposition methods used in the micro-nano manufacturing process of integrated circuits include pulsed laser deposition, electron beam evaporation, and magnetron sputtering. Among them, the magnetron sputtering process can controllably prepare thin films over a large area, and the prepared thin films have the advantages of being dense, having few pinholes, and having high purity, so it has been widely used.

The magnetron sputtering system can sputter various metal and ceramic targets by introducing RF power and reactive gas, and control the reactive sputtering environment to obtain compound films that meet the requirements. The magnetron sputtering system is usually composed of a vacuum system, a target gun, a power supply and a control system. Its film-forming principle is mainly to apply voltage between the target anode and the target cathode to ionize the sputtering source gas (such as argon, xenon, etc.) near the target to form a plasma. The cations in the plasma collide with the target under the action of the electric field to make the target atoms detach and move to the substrate to deposit into a film, while the electrons in the plasma continue to move on the target surface under the action of the magnetic field on the target surface and further ionize the sputtering source gas, thereby continuously producing sputtering products.

In the magnetron sputtering process, it can usually be considered that the product is distributed isotropically, and theoretically the uniformity of the product film is good. However, in the reactive magnetron sputtering process, in addition to the plasma source gas, reactive gases such as oxygen and nitrogen are also introduced, making the sputtering process more complicated. The reactive gas can react not only with the product film, but also with the target surface, thereby affecting the spatial distribution of the product atoms, and ultimately affecting the thickness of the product deposited on the substrate surface and the uniformity of the stoichiometric ratio.

SUMMARY OF THE INVENTION

In order to solve the problem that the introduction of reaction gas in the existing magnetron sputtering process causes the product atoms to be distributed in a gradient on the substrate surface, the purpose of the present invention is to provide a method for improving the uniformity of rare earth nickelate thin films deposited by reactive magnetron sputtering.

The present invention can realize the control of the gradient of element content and thickness gradient in the rare earth nickelate oxide film prepared by reactive magnetron sputtering, so as to obtain a film with the required stoichiometric ratio and thickness uniformity, and improve the performance of the product.

To achieve the above objectives, the technical solution of the present invention is as follows.

The present invention provides a method for improving the uniformity of a rare earth nickelate film deposited by reactive magnetron sputtering, comprising the following steps:

Install rare earth (RE) target, Ni target and substrate;

Adjust the sputter angle of the Ni target toward the substrate, and then perform magnetron sputtering under a reaction gas to deposit an oxide film on the substrate, obtaining Ni element content data;

Analyze the content data of Ni element under the corresponding sputter angle to select the sputter angle that realizes zero gradient deposition of Ni element on the substrate surface;

Adjust the sputter angle of the RE target toward the substrate, and then performing magnetron sputtering under a reaction gas to deposit an oxide film on the substrate, and obtain content data of the RE element;

Analyze the content data of RE elements at corresponding sputter angles to select the sputter angle that realizes zero-gradient deposition of RE elements on the substrate surface;

According to the selected sputter angle, magnetron sputtering is performed under a reaction gas to deposit a rare earth nickelate film $RENiO_x$ on the substrate to improve the deposition uniformity of the rare earth nickelate film.

In some preferred embodiments, the reaction gas is a mixture with an oxygen content of 20-40%; RE is a rare earth metal element.

In some preferred embodiments, the content data of the element is obtained by measuring the thickness gradient of the oxide film of the corresponding element. The characterization method of the element content in the present invention includes but is not limited to the thickness of the film. One embodiment of the present invention mainly characterizes the element content by the thickness of the film. The acquisition of the thickness gradient requires sputtering $NiO_x$ and $NdO_x$ films separately. Of course, in other embodiments, other methods of obtaining the element content can also be used. Other methods of obtaining the element content include a method of directly sputtering a $RENiO_x$ film to obtain the contents of two elements at one time.

In some preferred embodiments, the zero gradient deposition is a gradient formed by taking the element content at the center of the substrate as the reference value, and the variation of the element content along the radial direction is close to zero. Preferably, the zero gradient deposition is a gradient formed by taking the oxide film deposition thickness at the center of the substrate as the reference value, and the variation of the oxide film deposition thickness along the radial direction is close to zero.

In some preferred embodiments, the element content data is obtained by starting from the center of the substrate, selecting multiple test points along the radial direction, and obtaining the element content of the corresponding test points to construct the content data of the corresponding element along the radial direction. Preferably, the element content data is obtained by starting from the center of the substrate, selecting multiple test points along the radial direction, and obtaining the oxide film deposition thickness of the corresponding test points to obtain the thickness data of the corresponding element distributed along the radial direction.

In some preferred embodiments, the content data of Ni or RE element at the corresponding sputter angle is analyzed, including: gradient deposition type analysis, gradient analysis and uniformity analysis. Preferably, the thickness data of $NiO_x$ film or $REO_x$ film at the corresponding sputter angle is analyzed, including: gradient deposition type analysis, gradient analysis and thickness uniformity analysis.

In some preferred embodiments, the gradient deposition type analysis is to draw a content ratio-position curve with the position of the corresponding test point as the horizontal coordinate and the content ratio of the element as the vertical coordinate, and the gradient deposition type is determined according to the element distribution profile of the content ratio-position curve;

The calculation formula of the content ratio is:

$$\text{content ratio} = \frac{\text{content at test point} - \text{content at center of substrate}}{\text{content at center of substrate}} \times 100\%.$$

In some preferred embodiments, the calculation formula of the uniformity is:

$$\text{uniformity} = \frac{\text{maximum content} - \text{minimum content}}{\text{average content} \times 2} \times 100\%;$$

The calculation formula of the gradient analysis is:

$$\text{gradient} = \frac{\text{substrate edge content} - \text{substrate center content}}{\text{substrate edge content} \times \text{center to the edge distance}} \times 100\%.$$

In some preferred embodiments, the conditions for selecting the sputter angle for achieving zero gradient deposition of RE elements or Ni elements on the substrate surface are:

The gradient deposition type is zero gradient deposition, and the absolute value of the gradient is ≤1%/cm.

In some preferred embodiments, the configuration that the target parallel to the substrate is taken as the initial position, and the sputter angle of the target is the angle of the line from the target to the rotation center deviates from its initial position.

In some preferred embodiments, the substrate is rotated along the axis at a speed of 10-20 rpm during magnetron sputtering;

The RE target material is an RE target material with a purity of ≥99.9%; RE is any one of La, Pr, Nd, and Sm;

The Ni target material is a Ni target material with a purity of ≥99.9%;

The substrate is a silicon substrate.

BENEFICIAL EFFECTS OF THE PRESENT INVENTION

1. The present invention achieves regulation of the element content gradient of rare earth nickelate thin film by changing the incident angles $\theta_1$ and $\theta_2$ of the reactive magnetron sputtering product atoms, so as to solve the problem that the introduction of reactive gas in the state of art magnetron sputtering process compromises the uniformity of film thickness and stoichiometric ratio.

2. The method of the present invention is low cost and easy to operate, and is potential to provide certain guidance for improving the electrical performance of chip devices.

DETAILED DESCRIPTION

Figure 1:
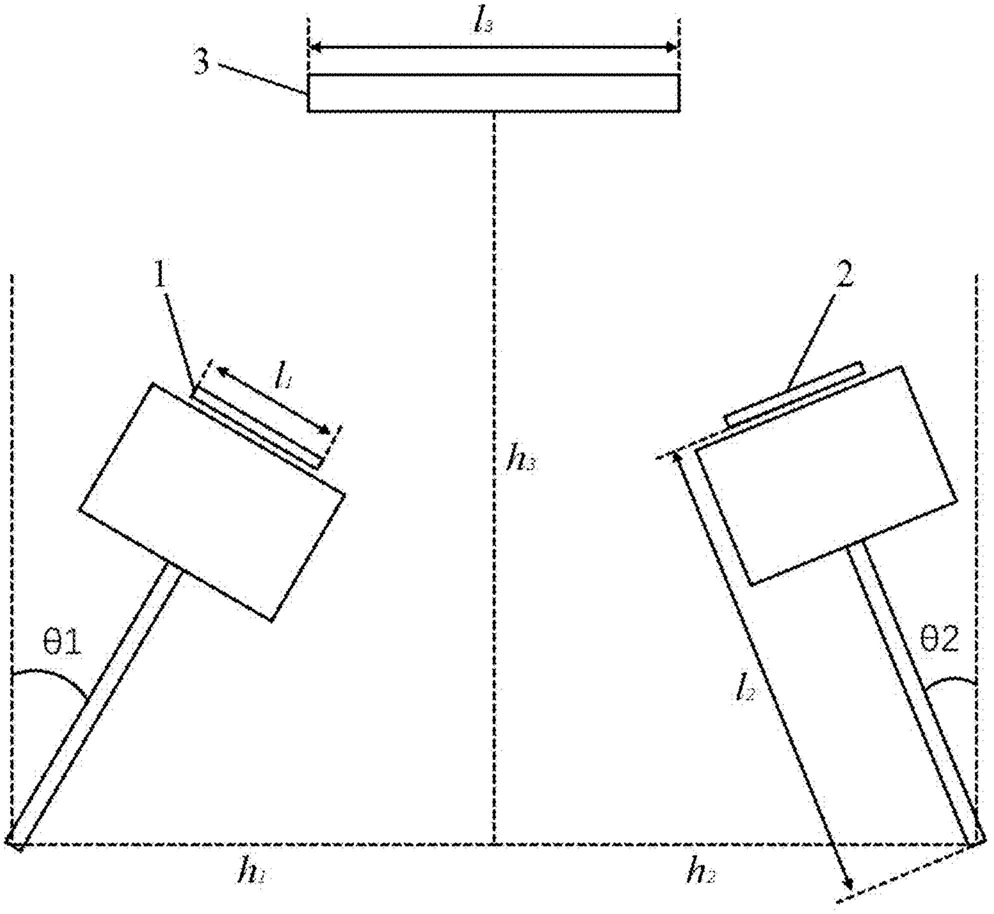
FIG. 1 is a schematic diagram of the target incident angle, wherein 1, Ni target; 2, RE target; 3, substrate; $\theta_1$ is the angle of the Ni target deviating from the initial position; $\theta_2$ is the angle of the RE target deviating from the initial position.

In order to make the purpose, technical solution and advantages of the present invention more clearly understood, the present invention is further described in detail below in conjunction with the embodiments. It should be understood that the specific embodiments described herein are only used to explain the present invention and are not used to limit the present invention.

All other embodiments obtained by ordinary technicians in this field without making any creative work shall fall within the scope of protection of the present invention.

At present, in the magnetron sputtering process, it can usually be considered that the product is isotropically distributed, and theoretically the uniformity of the product film is good. However, in the reactive magnetron sputtering process, in addition to the plasma source gas, reactive gases such as oxygen and nitrogen are also introduced, making the sputtering process very complicated. Usually, the reactive gas can react not only with the product film, but also with the surface of the target material, thereby affecting the spatial distribution gradient of the product atoms on the substrate surface, and then affecting the uniformity of the deposited film.

In the process of integrated circuit micro-nano manufacturing, as key dimensions such as gate and channel materials gradually decrease, rare earth nickelate films are gradually applied to field effect transistors to improve the switching resistance of channel materials. In the preparation process of rare earth nickelate films, the thickness and uniformity of the films gradually affect the electrical properties of chip devices. Even a very small deviation will cause serious deviations in the electrical properties of chip devices. Therefore, it is particularly important to ensure the stoichiometric ratio and thickness uniformity of nickelate films on chip devices.

The currently commonly used reactive magnetron sputtering method is to prepare rare earth nickelate films under a single fixed product atom incident angle. This method cannot achieve precise control of the stoichiometric ratio and thickness gradient of the film, and cannot solve the problem that the introduction of reactive gas in the existing magnetron sputtering process affects the uniformity of the distribution of product atoms in the deposited film.

To solve the above problems, the present invention achieves regulation of the stoichiometric ratio and thickness gradient of the rare earth nickelate film by changing the incident angles $\theta_1$ and $\theta_2$ of the reactive magnetron sputtering product atoms, so as to solve the problem that the introduction of reactive gas in the existing magnetron sputtering process affects the distribution uniformity of the product atoms in the deposited film.

The present invention provides a method for improving the uniformity of a rare earth nickelate film deposited by reactive magnetron sputtering, comprising the following steps:

(1) Install RE target, Ni target and substrate;

(2) adjusting the sputter angle of the Ni target toward the substrate, and then performing magnetron sputtering under the reaction gas to deposit an oxide film on the substrate, and obtaining Ni element content data;

(3) Analyze the content data of the Ni element at the corresponding sputter angle to select the sputter angle that achieves zero gradient deposition of the Ni element on the substrate surface;

(4) adjusting the sputter angle of the RE target toward the substrate, and then performing magnetron sputtering under the reaction gas to deposit an oxide film on the substrate, and obtaining the content data of the RE element;

(5) Analyze the content data of the RE element at the corresponding sputter angle to select the sputter angle that achieves zero gradient deposition of the RE element on the substrate surface;

(6) According to the selected sputter angle, the sputter angles of the Ni target and the RE target toward the substrate are adjusted, and magnetron sputtering is performed under a reaction gas to deposit a rare earth nickelate film $RENiO_x$ on the substrate to improve the deposition uniformity of the rare earth nickelate film.

For step (1):

In some preferred embodiments, the specific operations are:

The RE target, Ni target and substrate are respectively installed at corresponding working positions in the reaction chamber; RE is a rare earth metal element.

In some preferred embodiments, the RE target material is an RE target material with a purity of ≥99.9%; RE is any one of La, Pr, Nd, and Sm; in the present invention, RE can be selected from other rare earth metal elements, and the present invention does not limit the specific type of RE, which can be selected according to actual needs.

The Ni target material is a Ni target material with a purity of ≥99.9%;

The substrate is a silicon substrate.

In a preferred embodiment, before the substrate is installed at the corresponding working position in the reaction chamber, the substrate is also cleaned. The specific process of the cleaning is:

The substrate was ultrasonically cleaned in acetone, ethanol, and deionized water in sequence and then dried with nitrogen.

For steps (2) and (4):

In some preferred embodiments, the content data of the element is obtained by measuring the thickness gradient of the oxide film of the corresponding element. The characterization method of the element content in the present invention includes but is not limited to the thickness of the film. One embodiment of the present invention mainly characterizes the element content by the thickness of the film. The acquisition of the thickness gradient requires sputtering $NiO_x$ and $NdO_x$ films separately. Of course, in other embodiments, other methods of obtaining the element content can also be used. Other methods of obtaining the element content include a method of directly sputtering a $RENiO_x$ film to obtain the contents of two elements at one time.

In some preferred embodiments, the element content data is obtained by starting from the center of the substrate, selecting multiple test points along the radial direction, and obtaining the element content of the corresponding test points to obtain the content data of the corresponding element distributed along the radial direction. Preferably, the element content data is obtained by starting from the center of the substrate, selecting multiple test points along the radial direction, and obtaining the oxide film deposition thickness of the corresponding test points to obtain the thickness data of the corresponding element distributed along the radial direction.

In some preferred embodiments, the reaction gas is a reaction gas containing 20-40% oxygen. Preferably, the reaction gas is a mixture of argon and oxygen, and the oxygen content accounts for 20-40% of the volume of the reaction gas. For example, the oxygen content is 20%, 22%, 24%, 26%, 28%, 30%, 32%, 34%, 36%, 38%, 40%, etc. The oxygen content can be selected according to actual needs.

In some preferred embodiments, the position where the target is parallel to the substrate is taken as the initial position, and the sputter angle of the target is the angle at which the line from the target to the rotation center deviates from the initial position.

In some preferred embodiments, the initial positions of the RE target and the Ni target are set parallel to the substrate; the RE target and the Ni target are deflected toward the substrate, so that the angle of deviation of the Ni target from the initial position is $\theta_1$, and the angle of deviation of the RE target from the initial position is $\theta_2$; with the adjustment of $\theta_1$ and $\theta_2$, the deposition uniformity of RE and Ni on the substrate surface along the radial direction is regulated.

For example, when $22° < \theta_1 < 35°$, the Ni element is deposited on the substrate surface along the radial direction with a gradient control; when $22° < \theta_2 < 35°$, the RE element is deposited on the substrate surface along the radial direction with a gradient control. When $\theta = 22°$, the target faces the edge of the substrate, and when $\theta = 35°$, the target faces the center of the substrate. Preferably, when $\theta_1 = 31°$, the uniformity of zero-gradient deposition of the Ni element on the substrate surface along the radial direction is achieved; when $\theta_2 = 27°$, the uniformity of zero-gradient deposition of the RE element on the substrate surface along the radial direction is achieved.

In the embodiment of the present invention, the value range of $\theta_1$ and $\theta_2$ can be a sputter angle of one end of the target toward the substrate as one endpoint value and a sputter angle of the other end of the target toward the substrate as another endpoint value.

In a preferred embodiment, the vertical distance between the initial positions of the RE target and the Ni target and the substrate is 7-9 cm.

In a preferred embodiment, the reaction chamber is provided with two target seats, and the RE target and the Ni target are respectively installed on corresponding target seats.

In a preferred embodiment, the target seat corresponding to the RE target is connected to a sputtering power source I; and the target seat corresponding to the Ni target is connected to a sputtering power source II.

In a preferred embodiment, the sputtering power of the sputtering power supply I is 80-120 W; the sputtering power of the sputtering power supply II is 40-90 W.

In a preferred embodiment, a tray is provided in the reaction chamber, and the tray is installed on the substrate.

In some preferred embodiments, the substrate rotates along the axis at a speed of 10-20 rpm during the magnetron sputtering process; specifically, the tray in the reaction chamber rotates along the axis at a speed of 10-30 rpm during the magnetron sputtering process.

For steps (3) and (5):

In some preferred embodiments, the content data of Ni or RE element at the corresponding sputter angle is analyzed, including: gradient deposition type analysis, gradient analysis and uniformity analysis. Preferably, the thickness data of $NiO_x$ film or $REO_x$ film at the corresponding sputter angle is analyzed, including: gradient deposition type analysis, gradient analysis and thickness uniformity analysis.

In some preferred embodiments, the gradient deposition type analysis is to draw a thickness ratio-position change curve with the position of the corresponding test point as the horizontal coordinate and the thickness ratio as the vertical coordinate, and the gradient deposition type is judged according to the element distribution trend of the thickness ratio-position change curve; the calculation formula of the content ratio is:

$$\text{content ratio} = \frac{\text{content at test point} - \text{content at center of substrate}}{\text{content at center of substrate}} \times 100\%.$$

In some preferred embodiments, the calculation formula of the uniformity is:

$$\text{uniformity} = \frac{\text{maximum content} - \text{minimum content}}{\text{average content} \times 2} \times 100\%$$

The calculation formula of the gradient analysis is:

$$\text{gradient} = \frac{\text{substrate edge content} - \text{substrate center content}}{\text{substrate edge content} \times \text{center to the edge distance}} \times 100\%.$$

In some preferred embodiments, the conditions for selecting the sputter angle for achieving zero gradient deposition of RE elements or Ni elements on the substrate surface are:

The gradient deposition type is zero gradient deposition, and the absolute value of the gradient is ≤1%/cm.

In some preferred embodiments, the gradient deposition types include: positive gradient deposition, negative gradient deposition and zero gradient deposition.

In some preferred embodiments, the positive gradient deposition is a gradient formed by continuously increasing the oxide film deposition thickness in the radial direction with the oxide film deposition thickness at the center of the substrate as a reference value.

In some preferred embodiments, the negative gradient deposition is a gradient formed by continuously reducing the oxide film deposition thickness in the radial direction with the oxide film deposition thickness at the center of the substrate as a reference value.

In some preferred embodiments, the zero gradient deposition is a gradient formed by taking the oxide film deposition thickness at the center of the substrate as a reference value, and the variation of the oxide film deposition thickness along the radial direction is close to zero.

In a preferred embodiment, as shown in FIG. 1, magnetron sputtering is performed in a reaction chamber, wherein two target seats are provided in the reaction chamber, and Ni target 1 and RE target 2 are respectively mounted on the two target seats, and a tray is provided in the reaction chamber, and the position of the tray corresponds to the position of the two target seats, and the tray is mounted on the substrate. A substrate 3 is mounted on the tray. In the initial position, Ni target 1 and RE target 2 are both parallel to substrate 3 and in a horizontal state. The line connecting Ni target 1 and RE target 2 to the rotation center of the target seat is in a vertical state. As both RE target and Ni target deflect toward the substrate, the angle at which Ni target deviates from the initial position is $\theta_1$, and the angle at which RE target deviates from the initial position is $\theta_2$; as $\theta_1$ and $\theta_2$ are adjusted, the deposition uniformity of RE and Ni on the substrate surface in the radial direction is regulated. Among them, the position of the target parallel to the substrate is taken as the initial position, and the sputter angle of the target is the angle at which the line connecting the target to the rotation center deviates from the initial position.

Taking Nd target and Ni target as examples, the magnetron sputtering method is used to prepare rare earth nickelate thin films, and the deposition uniformity of the rare earth nickelate thin films is improved.

Figure 2:
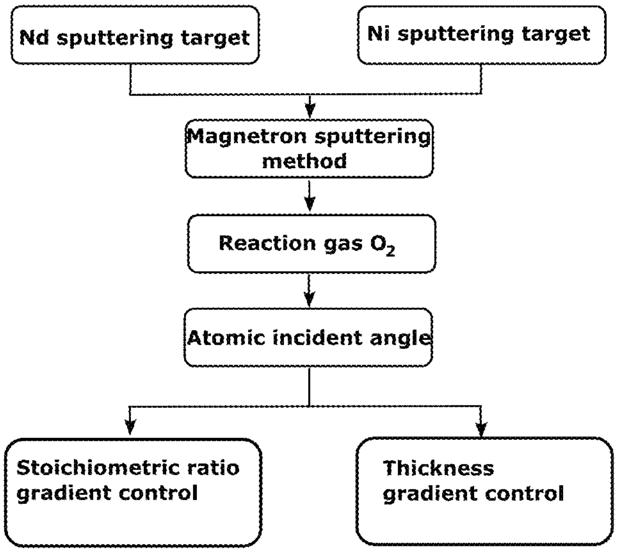
FIG. 2 is a process flow chart of a method for improving the uniformity of rare earth nickelate thin films deposited by reactive magnetron sputtering according to an embodiment of the present invention.

In a preferred embodiment, referring to FIG. 1 and FIG. 2, a method for improving the uniformity of rare earth nickelate thin films deposited by reactive magnetron sputtering comprises the following steps:

1) Installing the target: The Nd target and the Ni target are respectively installed on corresponding target holders in the magnetron sputtering reaction chamber, and the target holder corresponding to the Nd target is connected to an RF power supply; the target holder corresponding to the Ni target is connected to a DC power supply.

The initial positions of the Nd target and the Ni target are set perpendicular to the horizontal plane of the reaction chamber; the Nd target and the Ni target are deflected toward the tray, so that the angle of the Ni target deviating from the initial position is $\theta_1$, and the angle of the Nd target deviating from the initial position is $\theta_2$; as shown in FIG. 1.

2) Substrate pretreatment: Place the silicon substrate in acetone, ethanol, and deionized water for ultrasonic cleaning. The ultrasonic power is 200-250 W and the ultrasonic time is 8-16 minutes. The cleaned silicon substrate is dried with nitrogen. The dried silicon substrate is mounted on a tray in the magnetron sputtering reaction chamber;

3) Preparation of $NiO_x$ thin film: evacuate the reaction chamber to form a vacuum reaction chamber, introduce reaction gas into the vacuum reaction chamber, and make the pressure in the reaction chamber be 0.4-0.6 Pa; the reaction gas is a mixture of argon and oxygen with an oxygen content of 20-40%; adjust $\theta_1$=31°, turn on the DC power supply, adjust the sputtering power to 40-90 W, the sputtering temperature to 25° C., and the sputtering time to 30-90 min to obtain a zero-gradient $NiO_x$ thin film;

4) Preparation of $NdO_x$ film: introduce reaction gas into the vacuum reaction chamber to make the gas pressure in the reaction chamber between 0.4 and 0.6 Pa; the reaction gas is a mixture of argon and oxygen with an oxygen content of 20 to 40%; adjust $\theta_2$=27°, turn on the RF power supply, adjust the sputtering power to 80-120 W, the sputtering temperature to 25° C., the sputtering time to 30 to 90 min, stabilize for 10 to 20 min after sputtering is completed, and finally form a zero-gradient deposited $NdO_x$ film on the surface of the silicon substrate.

SPECIFIC EMBODIMENTS

In order to have a clearer understanding of the technical features, purposes and beneficial effects of the present invention, the technical solution of the present invention is now described in detail below, but it should not be construed as limiting the applicable scope of the present invention.

It should be understood that the terms described in the present invention are only for describing special embodiments and are not intended to limit the present invention. In addition, for the numerical range in the present invention, it should be understood that each intermediate value between the upper and lower limits of the scope is also specifically disclosed. Each smaller range between the intermediate value in any stated value or stated range and any other stated value or intermediate value in the described range is also included in the present invention. The upper and lower limits of these smaller ranges can be independently included or excluded in the scope.

Unless otherwise specified, the methods described in the following examples are all conventional methods; the reagents and materials described are all commercially available unless otherwise specified.

Figure 6:
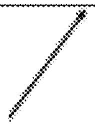
FIG. 6 shows the gradient classification.
Figure 6:
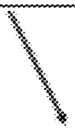
Figure 6:
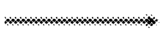

Please refer to FIG. 6 for the classification of different gradient depositions, wherein the types of gradient deposition include positive gradient deposition, negative gradient deposition and zero gradient deposition.

The positive gradient deposition is a gradient formed by continuously increasing the oxide film deposition thickness in the radial direction with the oxide film deposition thickness at the center of the substrate as a reference value.

The negative gradient deposition is a gradient formed by continuously reducing the oxide film deposition thickness in the radial direction with the oxide film deposition thickness at the center of the substrate as a reference value.

The zero gradient deposition is a gradient formed by taking the oxide film deposition thickness at the center of the substrate as a reference value and the variation of the oxide film deposition thickness along the radial direction being close to zero.

The following takes the synthesis of neodymium nickelate $NdNiO_x$ as an example to illustrate the method of controlling the element content gradient of rare earth nickelate film by reactive magnetron sputtering process to improve uniformity. The method of the following embodiment of the present invention is only used to explain the present invention, and is not used to limit the film of the present invention to neodymium nickelate $NdNiO_x$.

The Nd target material uses a Nd target material with a diameter of Φ50.8 mm, a thickness of 3 mm, and a purity of ≥99.9%; the Ni target material uses a Ni target material with a diameter of Φ50.8 mm, a thickness of 3 mm, and a purity of ≥99.9%.

$l_2$ of the target base is 137 mm; the distances h1 and h2 between the bottom of the two target bases and the vertical projection position of the center of the tray are both 165 mm; the vertical projection distance h3 between the tray and the bottom center of the two target bases is both 252 mm. The tray and the substrate have the same size, and the diameter l3 of the tray is @127 mm.

The sputtering conditions of each example are summarized in Table 1.

Example 1

A method for improving the uniformity of rare earth nickelate thin films deposited by reactive magnetron sputtering comprises the following steps:

1) Installing the target: The Nd target and the Ni target are respectively installed on corresponding target holders in the magnetron sputtering reaction chamber, and the target holder corresponding to the Nd target is connected to an RF power supply; the target holder corresponding to the Ni target is connected to a DC power supply.

The initial positions of the Nd target and the Ni target are set perpendicular to the horizontal plane of the reaction chamber; the Nd target and the Ni target are deflected toward the tray, so that the angle of the Ni target deviating from the initial position is $\theta_1$, and the angle of the Nd target deviating from the initial position is $\theta_2$; as shown in FIG. 1.

2) Substrate pretreatment: Place the silicon substrate in acetone, ethanol, and deionized water for ultrasonic cleaning. The ultrasonic power is 250 W and the ultrasonic time is 16 minutes. The cleaned silicon substrate is dried with nitrogen. The dried silicon substrate is mounted on a tray in the magnetron sputtering reaction chamber;

3) Preparation of $NiO_x$ thin film: evacuate the reaction chamber to form a vacuum reaction chamber, introduce reaction gas into the vacuum reaction chamber, and make the gas pressure in the reaction chamber be 0.4 Pa; the reaction gas is a mixture of argon and oxygen with an oxygen content of 20%; adjust $\theta_1$=31°, turn on the DC power supply, adjust the sputtering power to 60 W, the sputtering temperature to 25° C., and the sputtering time to 60 min, and form a zero-gradient deposited $NiO_x$ thin film on the surface of the silicon substrate;

4) Preparation of $NdO_x$ film: introduce reaction gas into the vacuum reaction chamber to make the gas pressure in the reaction chamber at 0.6 Pa; the reaction gas is a mixture of argon and oxygen with an oxygen content of 40%; adjust $\theta_2$=27°, turn on the RF power, adjust the sputtering power to 120 W, the sputtering temperature to 25° C., the sputtering time to 90 min, stabilize for 20 min after sputtering is completed, and form a zero-gradient deposited $NdO_x$ film on the surface of the silicon substrate.

Example 2

A method for improving the uniformity of rare earth nickelate thin films deposited by reactive magnetron sputtering comprises the following steps:

1) Installing the target: The Nd target and the Ni target are respectively installed on corresponding target holders in the magnetron sputtering reaction chamber, and the target holder corresponding to the Nd target is connected to an RF power supply; the target holder corresponding to the Ni target is connected to a DC power supply.

The initial positions of the Nd target and the Ni target are set perpendicular to the horizontal plane of the reaction chamber; the Nd target and the Ni target are deflected toward the tray, so that the angle of the Ni target deviating from the initial position is $\theta_1$, and the angle of the Nd target deviating from the initial position is $\theta_2$; as shown in FIG. 1.

2) Substrate pretreatment: Place the silicon substrate in acetone, ethanol, and deionized water for ultrasonic cleaning. The ultrasonic power is 250 W and the ultrasonic time is 16 minutes. The cleaned silicon substrate is dried with nitrogen. The dried silicon substrate is mounted on a tray in the magnetron sputtering reaction chamber;

3) Preparation of $NiO_x$ thin film: evacuate the reaction chamber to form a vacuum reaction chamber, introduce reaction gas into the vacuum reaction chamber, and make the pressure in the reaction chamber 0.4 Pa; the reaction gas is a mixture of argon and oxygen with an oxygen content of 20%; adjust $\theta_1$=22°, turn on the DC power supply, adjust the sputtering power to 60 W, the sputtering temperature to 25° C., and the sputtering time to 60 min, to obtain a positive gradient deposited $NiO_x$ thin film;

4) Preparation of $NdO_x$ film: introduce reaction gas into the vacuum reaction chamber to make the gas pressure in the reaction chamber at 0.6 Pa; the reaction gas is a mixture of argon and oxygen with an oxygen content of 40%; adjust $\theta_2$=22°, turn on the RF power supply, adjust the sputtering power to 120 W, the sputtering temperature to 25° C., the sputtering time to 90 min, stabilize for 20 min after sputtering is completed, and form a positive gradient deposited $NdO_x$ film on the surface of the silicon substrate.

Example 3

A method for improving the uniformity of rare earth nickelate thin films deposited by reactive magnetron sputtering comprises the following steps:

1) Installing the target: The Nd target and the Ni target are respectively installed on corresponding target holders in the magnetron sputtering reaction chamber, and the target holder corresponding to the Nd target is connected to an RF power supply; the target holder corresponding to the Ni target is connected to a DC power supply.

The initial positions of the Nd target and the Ni target are set perpendicular to the horizontal plane of the reaction chamber; the Nd target and the Ni target are deflected toward the tray, so that the angle of the Ni target deviating from the initial position is $\theta_1$, and the angle of the Nd target deviating from the initial position is $\theta_2$; as shown in FIG. 1.

2) Substrate pretreatment: Place the silicon substrate in acetone, ethanol, and deionized water for ultrasonic cleaning. The ultrasonic power is 250 W and the ultrasonic time is 16 minutes. The cleaned silicon substrate is dried with nitrogen. The dried silicon substrate is mounted on a tray in the magnetron sputtering reaction chamber;

3) Preparation of $NiO_x$ thin film: evacuate the reaction chamber to form a vacuum reaction chamber, introduce reaction gas into the vacuum reaction chamber, and make the pressure in the reaction chamber 0.4 Pa; the reaction gas is a mixture of argon and oxygen with an oxygen content of 20%; adjust $\theta_1$=35°, turn on the DC power supply, adjust the sputtering power to 60 W, the sputtering temperature to 25° C., and the sputtering time to 60 min, to obtain a negative gradient deposited $NiO_x$ thin film;

4) Preparation of $NdO_x$ film: introduce reaction gas into the vacuum reaction chamber to make the gas pressure in the reaction chamber at 0.6 Pa; the reaction gas is a mixture of argon and oxygen with an oxygen content of 40%; adjust $\theta_2$=35°, turn on the RF power, adjust the sputtering power to 120 W, the sputtering temperature to 25° C., the sputtering time to 90 min, stabilize for 20 min after sputtering is completed, and form a negative gradient deposited $NdO_x$ film on the surface of the silicon substrate.

Example 4

A method for improving the uniformity of rare earth nickelate thin films deposited by reactive magnetron sputtering comprises the following steps:

1) Installing the target: The Nd target and the Ni target are respectively installed on corresponding target holders in the magnetron sputtering reaction chamber, and the target holder corresponding to the Nd target is connected to an RF power supply; the target holder corresponding to the Ni target is connected to a DC power supply.

The initial positions of the Nd target and the Ni target are set perpendicular to the horizontal plane of the reaction chamber; the Nd target and the Ni target are deflected toward the tray, so that the angle of the Ni target deviating from the initial position is $\theta_1$, and the angle of the Nd target deviating from the initial position is $\theta_2$; as shown in FIG. 1.

2) Substrate pretreatment: Place the silicon substrate in acetone, ethanol, and deionized water for ultrasonic cleaning. The ultrasonic power is 250 W and the ultrasonic time is 16 minutes. The cleaned silicon substrate is dried with nitrogen. The dried silicon substrate is mounted on a tray in the magnetron sputtering reaction chamber;

3) Preparation of $NdNiO_x$ thin film: evacuate the reaction chamber to form a vacuum reaction chamber, introduce reaction gas into the vacuum reaction chamber to make the gas pressure in the reaction chamber 0.4 Pa; the reaction gas is a mixture of argon and oxygen with an oxygen content of 40%; adjust the sputtering angle of the Ni target to $\theta_1$=31°, turn on the DC power supply, adjust the sputtering power to 60 W, and the sputtering temperature to 25° C., adjust the sputtering angle of the Nd target to $\theta_2$=27°, turn on the RF power supply, adjust the sputtering power to 120 W, and the sputtering time to 90 min to obtain a zero-gradient deposited $NdNiO_x$ thin film.

TABLE 1

Sputtering conditions of various examples

| | Ni Sputtering Target | Nd Sputtering Target | Sputtering method | Gradient deposition type |
|---|---|---|---|---|
| Example 1 | $\theta_1 = 31°$ | $\theta_2 = 27°$ | Sputtering | Zero gradient deposition |
| Example 2 | $\theta_1 = 22°$ | $\theta_2 2 = 22°$ | Sputtering | Positive gradient deposition |
| Example 3 | $\theta_1 = 35°$ | $\theta_2 = 35°$ | Sputtering | Negative gradient deposition |
| Example 4 | $\theta_1 = 31°$ | $\theta_2 = 27°$ | Co-sputtering | Zero gradient deposition |

Testing and Result Analysis

Figure 5:
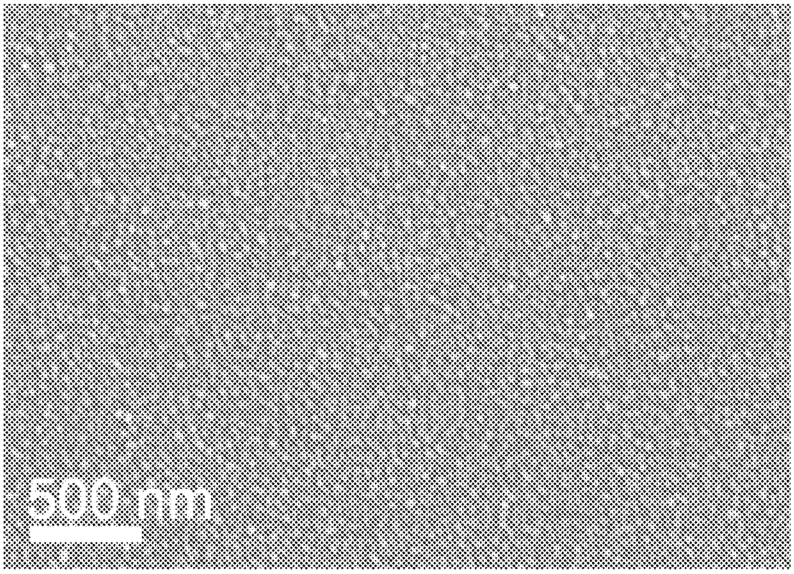
FIG. 5 is a field emission scanning electron microscope image of the neodymium nickelate $NdNiO_x$ thin film prepared under the conditions of Example 1.

The $NdNiO_x$ thin film prepared in Example 4 was tested by field emission scanning electron microscopy (FESEM), and the result is shown in FIG. 5. FIG. 5 is a field emission scanning electron microscopy image of the $NdNiO_x$ thin film prepared in Example 4.

$NdNiO_x$ film prepared in Example 4 is grown in sheets, the generated film covers the surface of the silicon substrate, and the surface of the film is flat and has no holes. It can be seen that adjusting $\theta_1$ to 31° and $\theta_2$ to 27° can achieve zero gradient deposition of Ni and Nd, thereby improving the thickness uniformity of the product film.

Test 2: Effect of Different Sputter Angles on Element Distribution Gradient

The radial thickness gradient of each oxide film along the silicon substrate in the films prepared in Examples 1 to 3 was tested using an atomic force microscope (AFM). The results are shown in FIG. 3.

Figure 3:
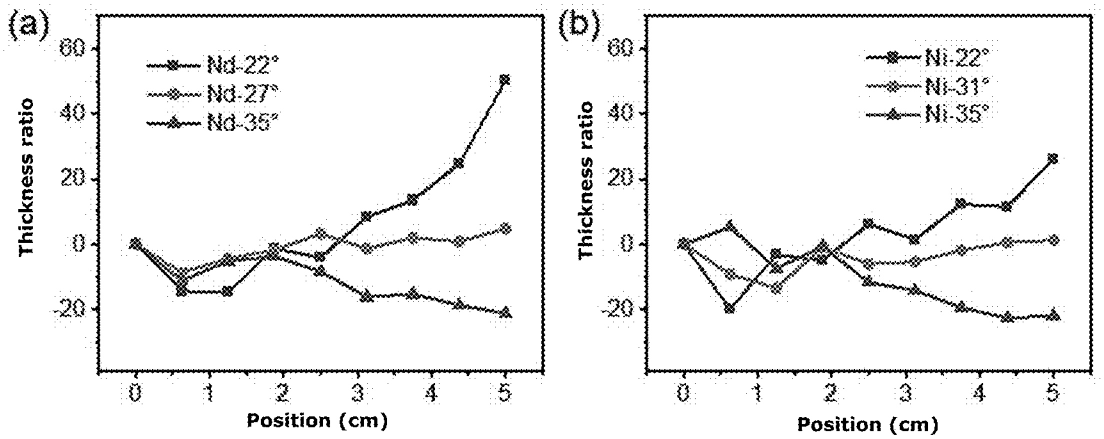
FIG. 3 shows analysis of thickness of films prepared in Examples 1 to 3. Panel (a) is a thickness ratio variation curve of the $NdO_x$ film prepared in Examples 1 to 3 along the radial direction of the silicon substrate; Panel (b) is a thickness ratio variation curve of the $NiO_x$ film prepared in Examples 1 to 3 along the radial direction of the silicon substrate.

FIG. 3 (*a*) is a thickness variation curve of the $NdO_x$ film prepared in Examples 1 to 3 along the radial direction of the silicon substrate; Figure (b) is a thickness variation curve of the $NiO_x$ film prepared in Examples 1 to 3 along the radial direction of the silicon substrate. The horizontal axis of FIG. 3 is the corresponding position of each element distributed along the radial direction of the silicon substrate; the vertical axis is the thickness ratio. The calculation formula of the thickness ratio is:

$$\text{content ratio} = \frac{\text{content at test point} - \text{content at center of substrate}}{\text{content at center of substrate}} \times 100\%$$

The thickness at the test point is the deposition thickness of each element at the corresponding position of the silicon substrate along the radial distribution; the thickness at the center of the substrate is the deposition thickness of each element at the center position of the silicon substrate.

Distribution of $NdO_x$ Thickness Along the Radial Direction in Examples 1 to 3

| Test Points | Position/cm | Thickness/nm Example 1 | Example 2 | Example 3 |
|---|---|---|---|---|
| 1 | 0 | 231 nm | 52.5 nm | 414.5 nm |
| 2 | 0.625 | 211 nm | 45 nm | 368.4 nm |
| 3 | 1.25 | 221 nm | 44.8 nm | 393.2 nm |
| 4 | 1.875 | 227 nm | 51.8 nm | 399.3 nm |
| 5 | 2.5 | 238.5 nm | 50.4 nm | 380 nm |
| 6 | 3.125 | 228 nm | 56.9 nm | 347.7 nm |
| 7 | 3.75 | 235.5 nm | 59.6 nm | 351.1 nm |
| 8 | 4.375 | 233 nm | 65.5 nm | 337.1 nm |
| 9 | 5 | 242.2 nm | 78.9 nm | 326.6 nm |
| gradient | | 0.97%/cm | 10.06%/cm | −4.24%/cm |
| Thickness uniformity | | 6.79% | 30.36% | 11.92% |

Distribution of $NiO_x$ Thickness Along the Radial Direction in Examples 1 to 3

| Test Points | Position/cm | Thickness/nm Example 1 | Example 2 | Example 3 |
|---|---|---|---|---|
| 1 | 0 | 136 nm | 50.3 nm | 193.4 nm |
| 2 | 0.625 | 123.6 nm | 40.3 nm | 203.7 nm |
| 3 | 1.25 | 117.7 nm | 48.7 nm | 179 nm |
| 4 | 1.875 | 134.8 nm | 47.8 nm | 192.1 nm |
| 5 | 2.5 | 127.8 nm | 53.4 nm | 170.8 nm |
| 6 | 3.125 | 128.7 nm | 51 nm | 166 nm |
| 7 | 3.75 | 133.5 nm | 56.5 nm | 155.9 nm |
| 8 | 4.375 | 136.8 nm | 56.1 nm | 149.6 nm |
| 9 | 5 | 137.7 nm | 63.5 nm | 151.1 nm |
| gradient | | 0.25%/cm | 5.25%/cm | −4.37%/cm |
| Thickness uniformity | | 7.65% | 22.33% | 15.59% |

Note:
0 cm represents the center of the silicon substrate; 0.625 to 5 cm represent the distance from the center of the silicon substrate. The standard for the gradient is that the absolute value of the gradient is ≤1%/cm.

The calculation formula for the thickness uniformity of the film in Table 3-4 is:

$$\text{uniformity} = \frac{\text{maximum content} - \text{minimum content}}{\text{average content} \times 2} \times 100\%$$

-continued $$\text{average thickness} = \frac{\text{sum of thickness}}{\text{number of test points}}$$

The sum of thicknesses is the sum of thicknesses corresponding to each test point.

The formula for calculating the gradient of the film is:

$$\text{gradient} = \frac{\text{substrate edge content} - \text{substrate center content}}{\text{substrate edge content} \times \text{center to the edge distance}} \times 100\%$$

The thickness at the edge of the substrate is the deposition thickness of each element at the edge of the silicon substrate; the thickness at the center of the substrate is the deposition thickness of each element at the center of the silicon substrate.

From FIG. 3 combined with Tables 3-4, it can be concluded that when the incident angle $\theta_2$ is 35°, the $NdO_x$ element at the edge of the tray is 21% thinner than that at the center of the tray; and when the incident angle $\theta_2$ is 22°, the $NdO_x$ element at the edge of the tray is 50% thicker than that at the center of the tray.

When the incident angle $\theta_1$ is 35°, the $NiO_x$ element at the edge of the tray is 22% thinner than that at the center of the tray; and when the incident angle $\theta_1$ is 22°, the $NiO_x$ element at the edge of the tray is 26% thicker than that at the center of the tray.

At the same time, when the incident angles $\theta_2$ and $\theta_1$ are 27° and 31° respectively, the thickness of $NdO_x$ and $NiO_x$ at the edge of the tray is equivalent to that at the center, indicating that at this angle, the thickness gradient of $NdO_x$ and $NiO_x$ films from the center to the edge on the substrate surface is small, and the absolute value of the gradient is ≤1%/cm, which meets the needs of practical applications, and the corresponding $NdNiO_x$ product film surface is flat and has no holes. This verifies that the thickness uniformity of the film can be controlled by adjusting the gradient of the two elements on the substrate surface.

Test 3: Energy Dispersive X-Ray Spectroscopy (EDS) was Used to Measure the Controllability and Horizontal Uniformity of the Nd:Ni Stoichiometric Ratio of the Zero-Gradient Deposited Thin Film in Example 4.

Figure 4:
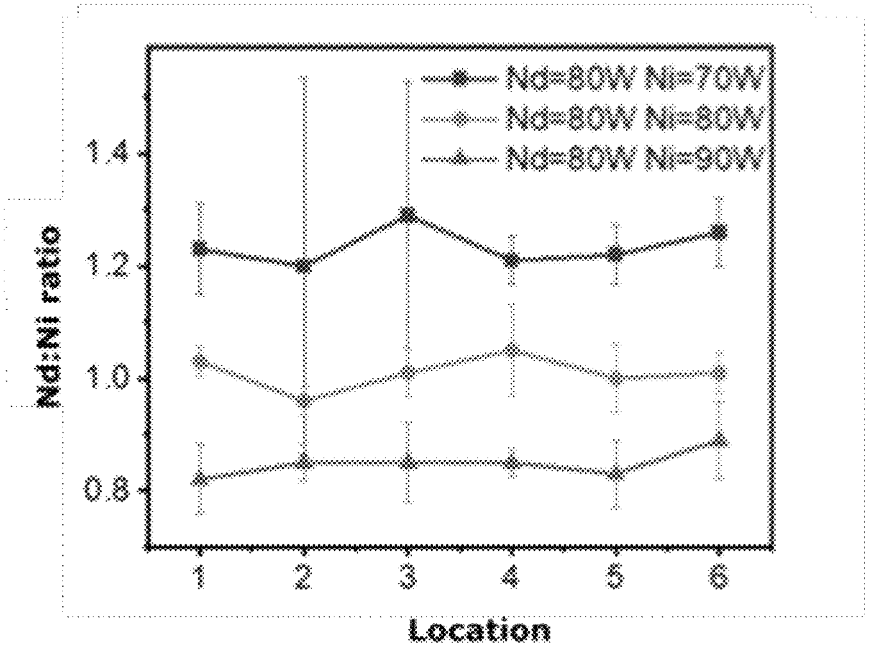
FIG. 4 is a schematic diagram showing the uniformity of the stoichiometric ratio of Nd:Ni elements in the zero gradient film along the radial direction of the silicon substrate at the sputter angles (Nd—27° and Ni—31°) of Example 1.

FIG. 4 is a schematic curve showing the uniformity of the stoichiometric ratio of Nd:Ni elements in the $NdNiO_x$ film along the radial direction of the silicon substrate at the sputter angles (Nd—27° and Ni—31°) of Example 4.

It can be seen from FIG. 4 that, under the premise of zero gradient deposition, the method of Example 4 can achieve stoichiometric ratio uniformity under different Nd to Ni element stoichiometric ratios.

In summary, the present invention achieves the regulation of the element content gradient of the rare earth nickelate film by changing the incident angles $\theta_1$ and $\theta_2$ of the atoms of the reactive magnetron sputtering, so as to solve the problem that the introduction of reactive gas in the existing magnetron sputtering process reduces the uniformity of the product film thickness and stoichiometric ratio. It is expected to provide guidance for improving the electrical performance of chip devices.

The above are only preferred embodiments of the present invention and are not intended to limit the present invention. Any modifications, equivalent substitutions and improvements made within the spirit and principles of the present invention should be included in the protection scope of the present invention.

The invention claimed is:

1. A method for improving uniformity of rare earth nickelate thin films deposited by reactive magnetron sputtering, comprising the following steps:

install a RE (rare earth element metal) target, Ni target and substrate;

adjust a sputter angle of the Ni target toward the substrate, and then perform magnetron sputtering under a reaction gas to deposit an oxide film on the substrate, and obtain Ni element content data;

analyze content data of Ni element at corresponding sputter angles to select a sputter angle that realizes zero-gradient deposition of Ni element on the substrate surface;

adjust a sputter angle of the RE target toward the substrate, and then perform magnetron sputtering under a reaction gas to deposit an oxide film on the substrate, and obtain content data of the RE element;

analyze the content data of RE element at corresponding sputter angles to select a sputter angle that realizes zero-gradient deposition of RE element on the substrate surface;

according to the selected sputter angle, perform magnetron sputtering under a reaction gas to deposit a rare earth nickelate film $RENiO_x$ on the substrate, wherein the zero-gradient deposition is a gradient formed by taking an element content at the center of the substrate as a reference value and wherein any change in content of said element along a radial direction is ≤1%/cm.

2. The method for improving uniformity of rare earth nickelate thin films deposited by reactive magnetron sputtering according to claim 1, characterized in that the reaction gas is a reaction gas with an oxygen content of 20-40%.

3. The method for improving uniformity of rare earth nickelate thin films deposited by reactive magnetron sputtering according to claim 1, characterized in that element content data starts from the center of the substrate, multiple test points are selected radially, and element content of corresponding test points is obtained to obtain content data of a corresponding element distributed along a radial direction.

4. The method for improving uniformity of rare earth nickelate thin films deposited by reactive magnetron sputtering according to claim 1, characterized in that a position of the target parallel to the substrate is taken as an initial position, and a sputter angle of the target is an angle at which the line connecting the target and a rotation center of the substrate deviates from the initial position.

5. The method for improving uniformity of rare earth nickelate thin films deposited by reactive magnetron sputtering according to claim 1, characterized in that the substrate is rotated along an axis at a speed of 10-20 rpm during the magnetron sputtering;

wherein, the RE target material is a RE target material with a purity of ≥99.9%; RE is any one of La, Pr, Nd, and Sm;

the Ni target material is a Ni target material with a purity of ≥99.9%; and the substrate is a silicon substrate.

* * * * *